United States Patent [19]

Beard et al.

[11] Patent Number: 4,945,774

[45] Date of Patent: Aug. 7, 1990

[54] SAMPLE TREATMENT APPARATUS

[75] Inventors: Nigel W. Beard, Forest Row; Robert B. Phillips, Horsham; Paul R. Stonestreet, Newport Pagnall, all of United Kingdom

[73] Assignee: VG Instruments Group Limited, Crawley, England

[21] Appl. No.: 283,623

[22] Filed: Dec. 13, 1988

[30] Foreign Application Priority Data

Dec. 15, 1987 [GB] United Kingdom ............... 8729262

[51] Int. Cl.$^5$ ............................................. G01N 1/28
[52] U.S. Cl. ............................. 73/863.11; 73/864.91; 310/104; 74/18.1; 250/492.2
[58] Field of Search ............... 73/863.11, 864.91, 863; 250/442.1, 492.2, 492.21, 492.22, 492.23, 492.24; 74/18.1; 310/104; 264/101; 29/569.1

[56] References Cited

U.S. PATENT DOCUMENTS

| | | | |
|---|---|---|---|
| 2,783,401 | 2/1957 | Foster et al. | 310/104 |
| 3,157,808 | 11/1964 | Lloyd | 310/104 |
| 3,181,873 | 5/1965 | Reed | 277/3 |
| 3,268,750 | 8/1966 | Gerber | 310/104 X |
| 3,356,874 | 12/1967 | Chiapaselli et al. | 310/104 X |
| 3,361,490 | 1/1968 | Bassan | 308/15 |
| 3,412,250 | 11/1968 | Arragon et al. | 250/492.1 |
| 3,435,128 | 3/1969 | Dörwald | 174/101 |
| 3,612,549 | 10/1971 | Berkowitz | 277/80 |
| 4,030,615 | 6/1977 | Guggi et al. | 214/1 BB |
| 4,538,068 | 8/1985 | Haney et al. | 250/443.1 |
| 4,548,699 | 10/1985 | Hutchison et al. | 204/298 |
| 4,550,411 | 10/1985 | Stonestreet et al. | 373/134 |
| 4,583,488 | 4/1986 | Brown, Jr. et al. | 118/500 |
| 4,683,763 | 8/1987 | Balter | 74/18.1 |
| 4,768,911 | 9/1988 | Balter | 414/3 |

FOREIGN PATENT DOCUMENTS

| | | |
|---|---|---|
| 108206 | 5/1984 | European Pat. Off. |
| 122088 | 10/1984 | European Pat. Off. |
| 145074 | 6/1985 | European Pat. Off. |
| 149869 | 7/1985 | European Pat. Off. |
| 432350 | 6/1934 | United Kingdom |
| 1146214 | 3/1969 | United Kingdom |

2158289 11/1985 United Kingdom.

OTHER PUBLICATIONS

Pearce S. J. & Barker S. L., A Simple, Fully Screened, High-Voltage Vacuum Feedthrough Journal of Physics E, 1977, vol. 10, No. 12, pp. 1231 to 1232.

Pararas A. Ceyer S. T. & Yates J. T., An O-Ring Sealed Rotary Feedthrough for UHV Applications Journal of Vacuum Science and Technology, 1982, vol. 21, No. 4, p. 1031.

Auciello O., Alonso E. V. & Baragiola R. A., Ultra-High Vacuum Rotary Manipulator with Direct Cooling Vacuum, 1976, vol. 26, No. 8, pp. 349 to 350.

de Haas E., The Harmonic Drive as UHV Rotary Motion Feedthrough Nuclear Instruments & Methods, 1976, vol. 137, pp. 435 to 439.

Parry A. A. & Linford R. G., A Harmonic Drive Used as an Ultrahigh Vacuum Rotary Feedthrough, Journal of Physics E, 1973, vol. 6, pp. 701 to 702.

(List continued on next page.)

*Primary Examiner*—Tom Noland
*Attorney, Agent, or Firm*—Chilton, Alix & Van Kirk

[57] ABSTRACT

An apparatus for the treatment of a sample in a vacuum enclosure having a wall on which a vacuum-tight feedthrough is mounted; the sample being supported on an elongate hollow rotor rotatable about an axis and disposed within the vacuum enclosure, the sample having a front face which is to be treated and also having a rear face; energy conducting means passing from the feedthrough towards the rear face of the sample through the rotor; inner magnet field generator(s) affixed to the rotor; outer magnet field generator(s) mounted to rotate outside of the vacuum enclosure about the axis, the outer magnetic field generator(s) being magnetically coupled to the inner magnet field generator(s), and thereby capable of causing the inner magnet field generator(s) and the rotor to rotate about their common axis; and a source for directing material or radiation at the front face.

16 Claims, 1 Drawing Sheet

OTHER PUBLICATIONS

Turkenburg W. C., de Haas E., Neutenboom A. F., Ladra J. & Kesten H. H., A Universal Target Manipulator for use in Ultra-High Vacuum Nuclear Instruments & Methods, 1975, vol. 126, pp. 241 to 245.

Engel T., High-Speed Rotary-Motion Feedthrough Suitable for UHV Applications Review of Scientific Instruments, 1981, vol. 52, No. 2, pp. 301 to 302.

di Giallonardo A., Dixon R. D. & Anderson K. L., Rotary Linear Motion Vacuum Feedthrough Journal of Vacuum Science and Technology, 1972, vol. 9, No. 6, p. 1442.

Larscheid J. & Kirschner J., UHV-Manipulator Attachment for Azimuthal Sample Rotation with Electrical Readout Review of Scientific Instruments, 1978, vol. 49, No. 10, pp. 1486 to 1488.

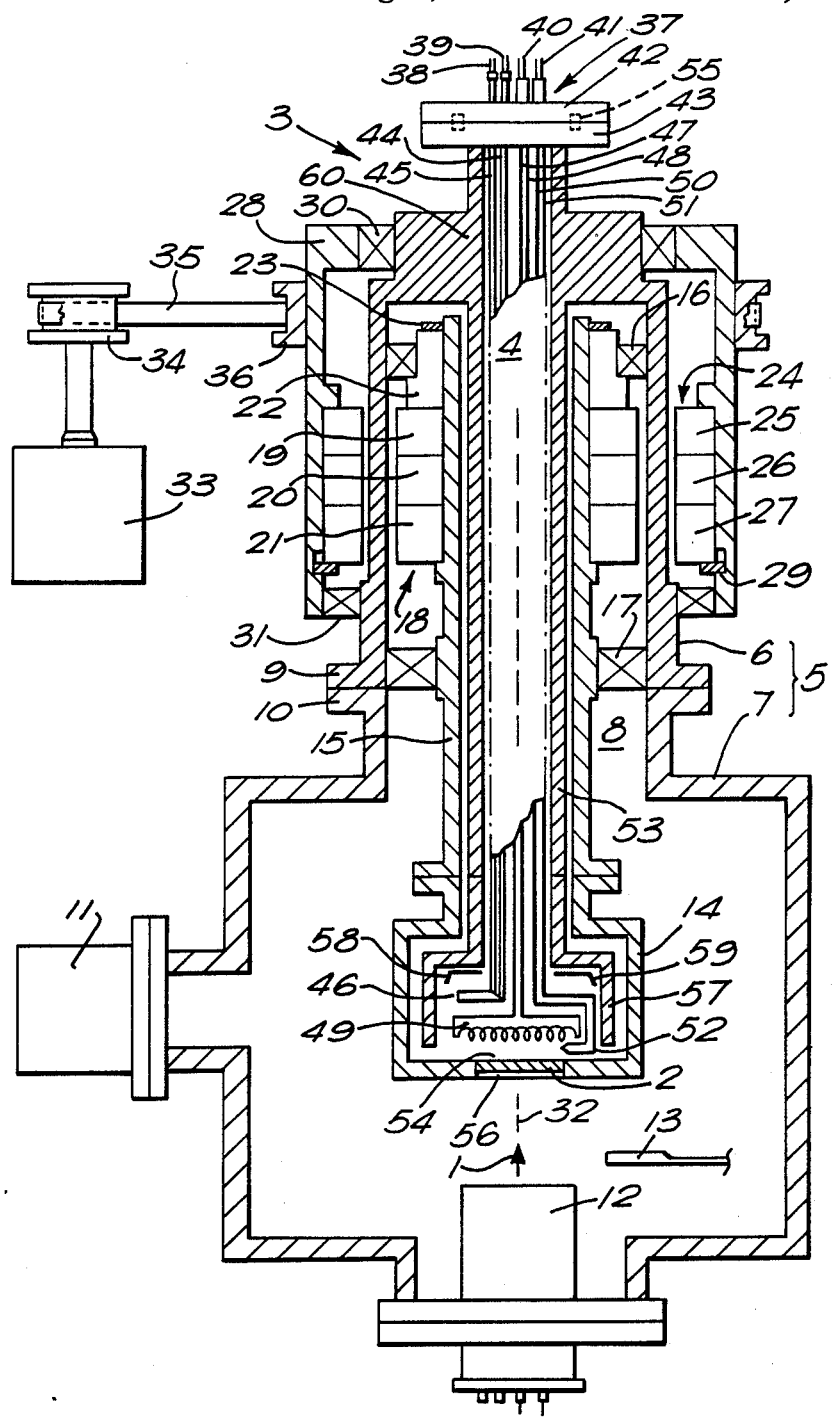

SAMPLE TREATMENT APPARATUS

BACKGROUND OF THE INVENTION

1. Field of the Invention

This invention relates to apparatus having means for rotating an object disposed within a vacuum chamber, and for providing services as heating or cooling thereto. The invention is particularly, though not exclusively, concerned with apparatus for the treatment by particulate beams or radiation of a heated, or cooled, continuously rotating sample maintained under ultra high vacuum conditions, and is especially useful in the processing of semiconductor substrates.

2. Description of the Related Art

A common requirement in vacuum systems is to have a facility for rotating an object, which is typically a sample presented for analysis or treatment. In transmitting rotary motion to the interior of a vacuum chamber it is important to maintain the integrity of the vacuum enclosure, which in the example of semiconductor processing apparatus means providing a seal compatible with ultra high vacuum (UHV) conditions, i.e, pressures of $10^{-8}$ Pa ($10^{-10}$ mbar) or less. It is also important to minimize any contamination which may be introduced by the material from which the rotary mechanism is fabricated.

Several types of rotary feedthroughs for vacuum systems are known. One type comprises a shaft or tube sealed by a compressible material where it passes through a wall into the vacuum enclosure. Such feedthroughs, which have been described for example in U.S. patent specification No. 3435128, and by S. J. Pearce and S. L. Barker in the Journal of Physics E, 1977, volume 10, pages 1231 to 1232, are particularly suitable for passing electrical current into or out of a vacuum chamber and, while they do allow some rotary displacement, they are not suitable for a continuous rotary drive, especially not for UHV. An improved rotary feedthrough may be achieved by providing a series of seals with pumps disposed to remove gases which leak past or outgas from the seals. Such a differentially pumped rotary seal has been described by A. Pararas et al in the Journal of Vacuum Science and Technology, 1982, volume 21 page 1031, and is UHV compatible but is most suitable for manually rotating a sample between discrete positions for treatment or analysis, rather than supplying continuous rotary motion. U.S. Pat. No. 3,181,873 reports that a differentially pumped rotary feedthrough may be operated continuously, while maintaining a vacuum pressure of $2.7 \times 10^{-7}$ Pa ($2.7 \times 10^{-9}$ mbar), but this is not a satisfactory vacuum for many modern applications, such as semiconductor processing. Another method for sealing a rotary shaft passing into a vacuum chamber is to use a magnetic fluid constrained by magnetic fields as described in U.S. Pat. No. 3,612,549 for example. Such seals are commercially known as Ferrofluidic ™ seals, and are available from the Ferrofluidics Corporation (USA); an example of the use of this type of seal for sealing a rotary shaft or electrode entrant into a semiconductor processing chamber is described in European Patent Application No. 0108206.

A shaft seal comprising a PTFE grommet has been described by O. Auciello et al in Vacuum, 1978, volume 26, pages 349 to 350, and was used for sealing around a rotatable assembly comprising tubes connected with, and carrying refrigerant to, a specimen holder. Again, this apparatus, though it is UHV compatible, is more suitable for specimen positioning than for prolonged continuous rotary motion. Mechanisms which are particularly advantageous for driving rotating shafts in UHV systems are those which do not have a seal around the shaft at the wall of the vacuum enclosure. Such mechanisms are: (i) magnetically coupled feedthroughs, as described in U.S. Pat. Nos. 3,157,808 and 3,268,750, in which rotary motion is transmitted by coupling between rotatable magnets inside and outside a vacuum enclosure; (ii) the harmonic drive, as described by E. de Haas in Nuclear Instruments and Methods, 1976 volume 137, pages 435 to 439, and A. A. Parry and R. G. Linford in the Journal of Physics E, 1973, volume 6, pages 701 to 702, in which rotary motion is transmitted, via a flexible membrane, between inner and outer rotating members; (iii) 'wobbling' or 'nutatory' bellows, as described for example by W. C. Turkenburg et al in Nuclear Instruments and Methods, 1975, volume 126, pages 241 to 245, in which a shaft is bent at one end where it is enclosed in a flexible bellows emergent from the wall of the vacuum chamber, and the shaft is rotated by moving the bellows in a circle; and (iv) a motor, having a stator outside and rotor inside a vacuum chamber as described by T. Engel in the Review of Scientific Instruments, 1981, volume 52, pages 301–302.

In semiconductor processing apparatus, disc-shaped substrates are commonly mounted on a substrate holder, which is itself in the form of a disc and is rotatable about an axis through its centre. One substrate may be mounted on such a disc, with the centers of the substrate and substrate holder being coincident and lying on the rotation axis, or a plurality of substrates may be mounted around a supporting disc at uniform angular separation. Means are generally provided to heat or cool the substrate material, it being particularly important to obtain a uniform temperature distribution across each substrate. The means for rotating the substrate holder must be disposed so as not to interfere with the desired positioning of heat sources or heat sinks, which in known apparatus effectively requires the rotary drive to be positioned off the axis of rotation. The substrate holder is driven via gears from a primary shaft rotating about an axis displaced from the axis of rotation of the substrate holder; the gears may transfer the axis of rotation through 90°. While such systems conveniently allow positioning of services near to a substrate holder they have disadvantages, notably: (i) complexity, and (ii) material released by wear from the gears may contaminate the substrates; it is especially important, for the performance of semiconductor devices, to minimize contamination in the manufacturing process.

SUMMARY OF THE INVENTION

It is therefore an object of the invention to provide improved apparatus for communicating services to a rotatable object disposed within a vacuum chamber. It is also an object of the invention to provide an apparatus for the treatment of a sample maintained in vacuum conditions, having means for rotating the sample while transmitting heat to or from the sample. It is a further object to provide an apparatus for semiconductor processing having a simplified rotary mechanism and in which contamination of semiconductor substrates is reduced over known apparatus.

According to one aspect of the invention there is provided an apparatus for communicating services to a continuously rotatable object disposed within a vacuum enclosure and comprising: a vacuum-tight feedthrough, mounted on a wall of said vacuum enclosure; a hollow rotor disposed within said vacuum enclosure, and rotatable about an axis; means for mounting said object onto said rotor at a position axially spaced apart from said vacuum-tight feedthrough; an actuator, mounted outside of said vacuum enclosure, substantially co-axial with said rotor, magnetically coupled to said rotor and thereby capable of causing said rotor to rotate about their common axis; and conducting means for conducting said services through, and at least in part within, said hollow rotor, between said feedthrough and said rotatable object.

Preferably the apparatus comprises a housing which may be removably and sealably attached to an opening in a vacuum chamber to form a vacuum enclosure; the rotor is mounted on internal bearing means; and each of the vacuum-tight feedthrough, the external actuator, and the internal bearing means are mounted co-axially on said housing, thereby providing a conveniently removable sub-assembly. Preferably the rotor comprises inner magnet means and the actuator comprises outer magnet means mounted, by means comprising outer bearings, to rotate about said axis. Alternatively the actuator may be the stator of a motor arrangement.

The apparatus is suitable for handling an object which has a front face, which is to be analyzed or treated (for example by ion bombardment or vapor deposition), and a rear face which may be heated or cooled to control the temperature of the object during processing. Such an object is mounted on the rotor with the rear face facing the conducting means. The conducting means conveniently passes, within the rotor, through an annulus about which the internal bearing means is distributed. In a preferred embodiment the rotor is an elongate hollow tube (concentric with said axis), the rotatable object is removably attached at one end of the tube, and the conducting means passes through that tube. The conducting means and rotation axis are substantially co-axial, and the rotation mechanism does not impede the conducting means, nor do either interfere with the path of any analytical or treatment energized beams applied to the front face of the object. The invention is particularly suitable for supplying services which require no physical contact between the stationary conducting means and the rotating object, as is the case for radiative heat transfer. However it is also within the scope of the invention to provide contact bearing means, such as a slip-ring, between the rotatable object, or the rotor, and elements of the conducting means. The apparatus may further comprise a non-rotating hollow sleeve, fixed at one end to the wall of the vacuum enclosure, preferably fixed to the sub-assembly housing, and projecting into the vacuum enclosure coaxial with said rotor, with the conducting means passing through said sleeve and with the tubular rotor rotating about said sleeve; this sleeve conveniently protects and separates the stationary conductors internal to it from the rotating rotor, the being open at its end which is not fixed to the wall, to allow the conducting means to serve the rotating object.

The services supplied by the conducting means may, for example, be a means for heating the rotatable object, in which case the apparatus may comprise a heating element and the conducting means may comprise means for conducting electrical power to that element. The apparatus may also comprise cooling means such as a cryopanel with tubes carrying refrigerant for conducting heat, radiated from the object, out of the vacuum enclosure. The services may also comprise temperature sensing means. The vacuum-tight feedthrough is preferably a conventional UHV feedthrough for feeding electrical current, or fluids such as liquid nitrogen, into a vacuum enclosure. In many applications the vacuum-tight feedthrough will itself be non-rotating in operation, however the invention is not restricted to this and a rotatable feedthrough may be provided if required.

According to another aspect of the invention there is provided an apparatus for the treatment of a sample in vacuum conditions, comprising: a vacuum enclosure having a wall on which a vacuum-tight feedthrough is mounted; said sample supported on an elongate hollow rotor rotatable about an axis and disposed within said vacuum enclosure, and having a front face which is to be treated and also having a rear face; energy conducting means passing from said feedthrough towards said rear face of said sample, through, and at least in part within, said rotor; inner magnet means affixed to said rotor; outer magnet means mounted to rotate outside of said vacuum enclosure about said axis, magnetically coupled to said inner magnet means, and thereby capable of causing said inner magnet means and said rotor to rotate about their common axis; and a source for directing material or radiation at said front face of said sample.

The sample is conveniently mounted on a rotatable sample holder affixed to the elongate rotor at a position axially spaced apart from the position at which the vacuum-tight feedthrough is mounted on the wall of the vacuum enclosure. Preferably the elongate rotor is mounted by means comprising bearing means onto said wall, the bearing means being mounted concentrically with said axis, distributed about an annulus through which said conducting means passes.

In a preferred embodiment the sample is a semiconductor substrate and the source is a particulate beam source such as, for example, a vapour deposition source, an ion source or a molecular beam source. The apparatus may comprise one sample or a plurality of samples mounted on the sample support.

In an especially preferred embodiment there is provided an apparatus for the processing or one or more semiconductor substrates having the features described above, and also comprising one or more of: a radiant heater, a cryogenic panel, or a temperature sensor, such as a thermocouple. The conducting means may comprise: wires connected to the radiant heater; pipes connected to the cryogenic panel; and wires connected to the thermocouple.

BRIEF DESCRIPTION OF THE DRAWING

A preferred embodiment of the invention will now be described in greater detail, by way of example, and with reference to the FIGURE which is a section through a vapor deposition system comprising apparatus according to the invention.

DESCRIPTION OF THE PREFERRED EMBODIMENT

The FIGURE illustrates an apparatus for the deposition of a material 1 onto a substrate 2, and having a means 3 (the composition of which will be described in greater detail below) for rotating substrate 2 while supplying it with services via a conducting means 4.

The vacuum deposition apparatus comprises a vacuum enclosure 5 which itself comprises a housing 6 and a vacuum chamber 7; housing 6 is attached to an opening 8 in chamber 7 by means of flanges 9 and 10 as shown. A vacuum pump 11 maintains a high vacuum, or especially an ultra high vacuum ($10^{-8}$ Pa), within enclosure 5 and at least one vacuum gauge (not shown) may also be provided. Material 1 is produced from a source 12, and a shutter 13 is provided to prevent or to allow the passage of material 1 from source 12 to substrate 2. A mechanical operating mechanism (not shown) is provided for shutter 13. Preferably the apparatus is adapted for molecular beam epitaxy and source 12 is a molecular beam source preferably, though not necessarily, constructed as described in European Patent Specification No. 0122088.

The substrate 2, which has a front face 56 and a rear face 54, is mounted in a substrate holder 14 which is fixed to an elongate rotor in the form of a rotatable hollow tube 15, mounted by an inner bearing means, comprising bearings 16 and 17, onto housing 6. An inner magnet means 18, comprising magnets 19,20 and 21, is affixed to tube 15, and is held in place by a collar 22 and a ring 23 screwed onto a thread on tube 15. An outer magnet means 24, comprising magnets 25,26 and 27 is fixed (held by a circlip or snap-ring 29) to an actuator which is in the form of a rotor 28, mounted by outer bearing means, comprising bearings 30 and 31, onto housing 6. When rotor 28 is rotated about housing 6 the flux linkage between outer magnet means 24 and inner magnet means 18 causes hollow rotor tube 15, support 14 and hence substrate 2 to rotate about an axis 32. A motor 33, wheel 34, drive belt 35 and wheel 36 (affixed to rotor 28) may be provided to rotate rotor 28, as shown.

Also shown is a feedthrough 37, comprising connectors 38, 39, 40 and 41 mounted on a flange 42 which is affixed by bolts (not shown) to a flange 43 attached to a wall 60 of a housing 6. There is a vacuum-tight seal 55 between flanges 42 and 43. The conducting means 4 comprises: tubes 44 and 45 through which coolant may pass to a cryopanel 46; electrical leads 47 and 48 connected to a radiant heater element 49; and leads 50 and 51 connected to a thermocouple 52. The conducting means 4 passes through a non-rotating hollow sleeve 53 which is fixed to the housing 6 as shown. Sleeve 53 is preferably formed to accomodate heater 49, cryopanel 46 and thermocouple 52, at its end 57 as shown. Heat shields 58 and 59 are also provided to protect the apparatus. The apparatus may not neccessarily have both heating and cooling facilities present, they are shown together for the purposes of illustration. It will be appreciated that support 14 may be adapted to hold more than one sample such as substrate 2; such samples would most conveniently be distributed in a circular fashion in the plane of substrate 2 perpendicular to axis 32. In operation the substrate 2 is continuously rotated as described, while material 1 from source 12 is directed towards front face 56 and rear face 54 is heated from heater 49. Cryogenic panel 46 is disposed to receive heat radiated from rear face 54, if required. In this way it is arranged that substrate 2 may be heated or have other services provided to it at rear face 54, while not interfering with the path of material 1 from source 12. The invention is particularly advantageous because it allows radiant heater 49, for example, to be positioned to uniformly heat rear face 54, while avoiding a complex gearing mechanism for rotating substrate 2. The invention is simpler and less prone to introduce contamination to processed semiconductor substrates, or other samples, than previously known apparatus.

What is claimed is:

1. An apparatus for communicating services to a continuously rotatable object disposed within a vacuum enclosure and comprising: vacuum-tight feedthrough means mountable on a wall of the vacuum enclosure; a hollow rotor, said rotor being rotatable about an axis; means for supporting said rotor from said feedthrough means whereby said rotor in use is disposed within the vacuum enclosure; means for mounting said object onto said rotor at a position axially spaced apart from said vacuum-tight feedthrough means; actuator means mounted outside of said vacuum enclosure, said actuator means being substantially co-axial with said rotor, said actuator means being magnetically coupled to said rotor and thereby capable of causing said rotor to rotate about said axis; and conducting means for conducting services through, and at least in part within, said hollow rotor between said feedthrough means and said mounting means.

2. An apparatus as claimed in claim 1 wherein said means for supporting said rotor comprises internal bearing means, and wherein said vacuum-tight feedthrough means further comprises a sub-assembly housing, said actuator means and said internal bearing means being mounted co-axially on said housing; wherein said housing is removably and sealably attachable to an opening in a vacuum chamber whereby the vacuum enclosure comprises the vacuum chamber and said housing.

3. An apparatus as claimed in claim 2 in which said rotor comprises inner magnet means and said actuator means comprises outer magnet means mounted, by means comprising outer bearings, to rotate about said axis.

4. An apparatus is claimed in claim 2 wherein said rotor comprises an elongated hollow tube concentric with said axis, said rotatable object being removably supported at one end of said tube by said mounting means.

5. An apparatus as claimed in claim 2 wherein said vacuum-tight feedthrough means comprises a non-rotating hollow sleeve, said sleeve being adapted to be fixed at one end to a wall of the vacuum enclosure and to project into the vacuum enclosure co-axially with said rotor, said conducting means passing through said sleeve, said rotor being rotatable about said sleeve.

6. An apparatus as claimed in claim 2 in which said rotatable object comprises at least one sample of semiconductor material, said apparatus further comprising a heating element positioned for radiatively heating a rear face of said sample, energy for activating said heating element being transmitted thereto by said conducting means, said apparatus also comprising means for treating said sample by directing material from a source toward a front face of said sample.

7. An apparatus as claimed in claim 1 in which said rotor comprises inner magnet means and said actuator means comprises outer magnet means mounted, by means comprising outer bearings, to rotate about said axis.

8. An apparatus as claimed in claim 1 in which said rotor comprises an elongated hollow tube concentric with said axis, and wherein said rotatable object is removably supported at one end of said tube by said mounting means.

9. An apparatus as claimed in claim 1 wherein said vacuum-tight feedthrough means comprises a non-rotating hollow sleeve, said sleeve being adapted to be fixed at one end to a wall of the vacuum enclosure and to project into the vacuum enclosure co-axially with said rotor, said conducting means passing through said sleeve, said rotor being rotatable about said sleeve.

10. An apparatus as claimed in claim 1 in which said rotatable object comprises at least one sample of semiconductor material, said apparatus further comprising a heating element positioned for radiatively heating a rear face of said sample, energy for activating said heating element being transmitted thereto by said conducting means, said apparatus also comprising means for treating said sample by directing material from a source toward a front face of said sample.

11. An apparatus for the treatment of a sample in vacuum conditions, comprising: a vacuum enclosure having a wall on which a vacuum-tight feedthrough is mounted; said sample supported on an elongate hollow rotor rotatable about an axis and disposed within said vacuum enclosure, and having a front face which is to be treated and also having a rear face; energy conducting means passing from said feedthrough towards said rear face of said sample, through, and at least in part within, said rotor; inner magnet means affixed to said rotor; outer magnet means mounted to rotate outside of said vacuum enclosure about said axis, magnetically coupled to said inner magnet means, and thereby capable of causing said inner magnet means and said rotor to rotate about their common axis; and a source for directing material or radiation at said front face of said sample.

12. An apparatus as claimed in claim 11 in which said sample is mounted on a rotatable sample holder affixed to said elongate rotor at a position axially spaced apart from the position at which the vacuum-tight feedthrough is mounted on said wall of said vacuum enclosure.

13. An apparatus as claimed in claim 11 in which said elongate rotor is mounted by means comprising bearing means onto said wall, said bearing means being mounted concentrically with said axis, distributed about an annulus through which said conducting means passes.

14. An apparatus as claimed in claim 11 and further comprising a non-rotating hollow sleeve, fixed at one end to said wall and projecting into said vacuum enclosure coaxially with said elongate hollow rotor, with said conducting means passing through said sleeve, and with said rotor rotatable about said sleeve.

15. An apparatus as claimed in claim 11 in which said sample is a semiconductor substrate and said source is a source of a molecular beam.

16. An apparatus as claimed claim 11 for the treatment of a rotatable sample of semiconductor material, said apparatus comprising a heating element (energised by energy transmitted along said conducting means) for radiatively heating a rear face of said sample, and also means for treating said sample by directing material from a source towards a front face of said sample.

* * * * *